(12) United States Patent
Reznicek et al.

(10) Patent No.: US 11,348,999 B2
(45) Date of Patent: May 31, 2022

(54) NANOSHEET SEMICONDUCTOR DEVICES WITH SIGMA SHAPED INNER SPACER

(71) Applicant: International Business Machines Corporation, Armonk, NY (US)

(72) Inventors: Alexander Reznicek, Troy, NY (US); Chun-Chen Yeh, Danbury, CT (US); Veeraraghavan S. Basker, Schenectady, NY (US); Junli Wang, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/817,692

(22) Filed: Mar. 13, 2020

(65) Prior Publication Data

US 2021/0288141 A1 Sep. 16, 2021

(51) Int. Cl.
| | | |
|---|---|---|
| H01L 29/06 | (2006.01) | |
| H01L 29/78 | (2006.01) | |
| H01L 29/417 | (2006.01) | |
| H01L 21/02 | (2006.01) | |
| H01L 29/66 | (2006.01) | |
| H01L 29/786 | (2006.01) | |
| H01L 29/423 | (2006.01) | |

(52) U.S. Cl.
CPC ...... *H01L 29/0665* (2013.01); *H01L 21/0259* (2013.01); *H01L 29/0673* (2013.01); *H01L 29/41791* (2013.01); *H01L 29/42392* (2013.01); *H01L 29/66795* (2013.01); *H01L 29/785* (2013.01); *H01L 29/78696* (2013.01); *H01L 2029/7858* (2013.01)

(58) Field of Classification Search
CPC ............ H01L 29/0665; H01L 29/78696
See application file for complete search history.

(56) References Cited

U.S. PATENT DOCUMENTS

| | | |
|---|---|---|
| 9,246,003 B2 | 1/2016 | Cheng et al. |
| 9,385,218 B1 | 7/2016 | Cheng et al. |
| 9,583,620 B2 | 2/2017 | Zhou et al. |
| 9,647,139 B2 | 5/2017 | Doris et al. |
| 9,721,827 B2 | 8/2017 | Lee et al. |
| 9,923,055 B1 | 3/2018 | Cheng et al. |
| 9,954,058 B1 | 4/2018 | Mochizuki et al. |
| 2012/0064686 A1 | 3/2012 | Farber et al. |
| 2014/0322879 A1 | 10/2014 | Li et al. |
| 2018/0219083 A1 | 8/2018 | Guillorn et al. |
| 2020/0058653 A1* | 2/2020 | Chiang ........... H01L 21/823821 |
| 2020/0075718 A1* | 3/2020 | Wang ................ B82Y 10/00 |
| 2020/0381545 A1* | 12/2020 | Chiang ............. H01L 29/775 |

* cited by examiner

*Primary Examiner* — Farun Lu
(74) *Attorney, Agent, or Firm* — Jeffrey M. Ingalls

(57) ABSTRACT

A method of manufacturing a nanosheet field effect transistor (FET) device is provided. The method includes forming a plurality of nanosheet stacks on a substrate, the nanosheet stacks including alternating layers of sacrificial layers and active semiconductor layers. The method includes removing portions of the sacrificial layers to form angular indents in each side thereof, then filling the indents with a low-κ material layer. The method further includes forming source drain regions between the nanosheet stacks, removing remaining portions of the sacrificial layers, and then forming gate metal layers in spaces formed by the removal of the sacrificial layers.

17 Claims, 12 Drawing Sheets

NANOSHEET SEMICONDUCTOR DEVICES WITH SIGMA SHAPED INNER SPACER

BACKGROUND

The present disclosure relates to fabrication methods and resulting structures for semiconductor devices. More specifically, the present disclosure relates to fabrication methods and resulting structures for nanosheet field effect transistors (FETs).

In certain semiconductor device fabrication processes, a large number of semiconductor devices, such as n-type field effect transistors (nFETs) and p-type field effect transistors (pFETs), are fabricated on a single wafer. Non-planar transistor device architectures (e.g., fin-type FETs (FinFETs) and nanosheet FETs) can provide increased device density and increased performance over planar transistors. As semiconductor integrated circuits (ICs) and/or chips become smaller, the implementation of stacked nanosheets in semiconductor devices has increased.

Nanosheets generally refer to two-dimensional nanostructures with a thickness range on the order of about 3 nanometers (nm) to about 100 nm, and they can facilitate the fabrication of non-planar semiconductor devices having a reduced footprint compared to conventional planar-type semiconductor devices.

For example, nanosheet transistors, in contrast to conventional planar FETs, include a gate stack that wraps around the full perimeter of multiple stacked nanosheet channel regions for a reduced device footprint and improved control of channel current flow. In general, nanosheet formation relies on the selective removal of one semiconductor (e.g., silicon (Si)) to another (e.g., silicon-germanium (SiGe)) to allow space between the stacked layers for subsequent formation of the wrap around gate stack structure. Nanosheet transistors also enable full depletion in the nanosheet channel regions and reduce short-channel effects. Accordingly, nanosheets and nanowires are seen as feasible options for reducing the footprints of semiconductor transistor devices to 7 nanometers or less.

SUMMARY

Embodiments of the present disclosure relate to a method of manufacturing a nanosheet field effect transistor (FET) device. The method includes forming a plurality of nanosheet stacks on a substrate, the nanosheet stacks including alternating layers of sacrificial layers and active semiconductor layers. The method includes removing portions of the sacrificial layers to form angular indents in each side thereof, then filling the indents with a low-κ material layer. The method further includes forming source drain regions between the nanosheet stacks, removing remaining portions of the sacrificial layers, and then forming gate metal layers in spaces formed by the removal of the sacrificial layers.

Other embodiments relate to a nanosheet FET device. The nanosheet FET device includes a plurality of nanosheet stacks provided on a substrate, the nanosheet stacks including alternating layers of gate metal layers and active semiconductor layers, where portions of the gate metal layers have angular indents formed in each side thereof, a low-κ material layer filling the indents in the gate metal layers, and source drain regions provided between the nanosheet stacks.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, explain the principles of the disclosure. The drawings are only illustrative of certain embodiments and do not limit the disclosure.

DETAILED DESCRIPTION

Figure 1:
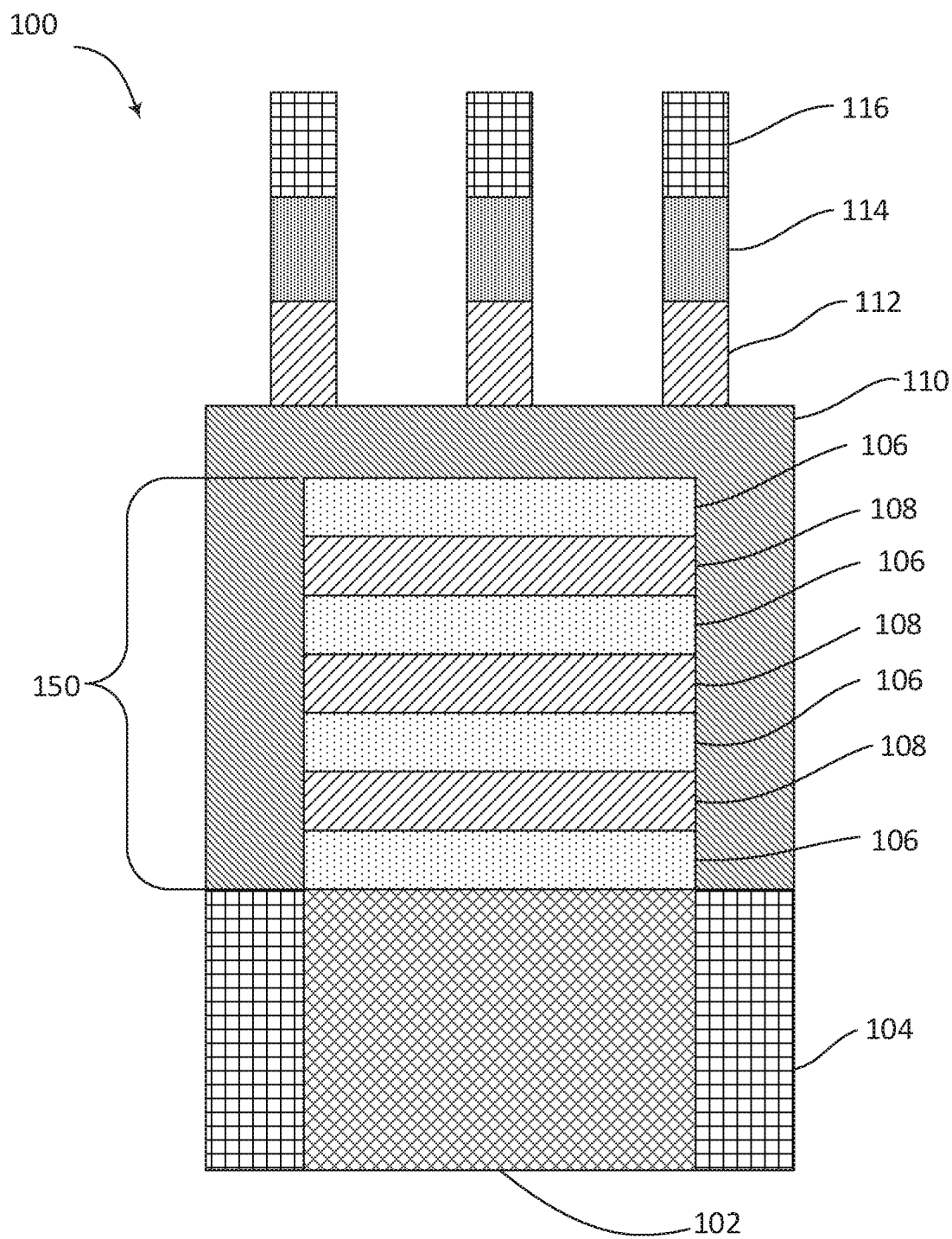
FIG. 1 depicts a cross-sectional view of a semiconductor nanosheet device at an intermediate stage of a semiconductor fabrication process flow, according to embodiments.

The present disclosure describes horizontally stacked gate-all-around (GAA) nanosheet structures (e.g., nanosheet field effect transistor (FET) devices) and methods of manufacturing the nanosheet structures. In particular, the present disclosure describes nanosheet FET devices where the inner spacer is formed by a self-limiting etch stopping at the crystalline <111> planes of the sacrificial interlayers, resulting in improved top to bottom uniformity as well as across wafer uniformity. Such etching techniques will be relatively slow due to the etching plane being <111>, and this slower etching is well controlled and results in the improved top to bottom uniformity. The self-aligned inner spacer formation results in improvement of the effective length ($L_{eff}$) and extension variation control. It also enables gate critical dimension (CD) scaling at the same $L_{eff}$, and this is equivalent to further device pitch scaling without sacrificing device performance with regard to channel electrostatics and/or contact resistance.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to an overview of technologies that are more specifically relevant to aspects of the present disclosure, semiconductor nanosheet devices typically include one or more suspended nanosheets that serve as the channel. An epitaxy process is typically performed to grow source/drain epitaxy structures from the surface of the wafer to contact the opposing ends of the nanosheets. A metal source/drain contact is then typically formed on the upper surface of the source/drain epitaxy structure to provide the final source/drain contacts of the device. As fabrication trends aim to continue reducing the footprints of semiconductor devices, the total contact area between the upper surface of the source/drain epitaxy structure and the lower surface of the metal source/drain contact is reduced.

The flowcharts and cross-sectional diagrams in the Figures illustrate methods of manufacturing nanosheet FET devices according to various embodiments. In some alternative implementations, the manufacturing steps may occur in a different order that that which is noted in the Figures, and certain additional manufacturing steps may be implemented between the steps noted in the Figures. Moreover, any of the layered structures depicted in the Figures may contain multiple sublayers.

Referring now to the drawings in which like numerals represent the same or similar elements and initially to FIG. 1, a semiconductor nanosheet device 100 is shown at an intermediate stage of the manufacturing process. The semiconductor nanosheet device 100 includes a silicon-based substrate 102 including a p-type semiconductor field effect transistor (PFET) region (not shown) and an n-type semiconductor field effect transistor (NFET) region (not shown). For example, when fabricating a p-type semiconductor region, the epitaxial grown material can be composed of a SiGe material doped with boron (B). When fabricating an n-type semiconductor region (e.g., an NFET region), the epitaxial grown material can be composed of a Si material doped with phosphorus (P) or arsenic (As). Thus, in certain embodiments, the silicon-based substrate 102 is doped in different areas with different materials to form the PFET and NFET regions.

As shown in FIG. 1, the device includes a nanosheet stack 150. In certain embodiments, a multi-layer nanosheet stack 150 is formed that includes alternating layers of a sacrificial layer 106 and an active semiconductor layer 108. The lowermost sacrificial layer 106 is formed on an upper surface of the silicon-based substrate 102. In an example, the sacrificial layers 106 are composed of a SiGe material (e.g., 30% silicon-germanium (SiGe30)), and the active semiconductor layers 108 are composed of silicon (Si). Several additional layers of the sacrificial layer 106 and the active semiconductor layer 108 are alternately formed. In particular, in FIG. 1, multiple epitaxial growth processes can be performed to form the sacrificial layers 106 and the active semiconductor layers 108. Subsequent to forming the initial sacrificial layer 106 on the substrate 102, a first active semiconductor layer 108 is epitaxially grown on an upper surface of the initial sacrificial layer 106. Thereafter, additional epitaxial growth processes may be performed to form the multi-layer structure as a nanosheet stack 150, which is an alternating series of active semiconductor layers 108 and sacrificial layers 106. As illustrated in FIG. 1, sacrificial layers 106 form the outermost two layers of the nanosheet stack 150. In the example illustrated in FIG. 1, there are a total of four sacrificial layers 106 and three active semiconductor layers 108 that are alternately formed. However, it should be appreciated that any suitable number of alternating layers may be formed.

The sacrificial layers 106 are composed of a first semiconductor material and the active semiconductor layers 108 are composed of a second semiconductor material, where the first and second semiconductor materials are different from each other. For example, the sacrificial layers 106 are composed of silicon-germanium (SiGe), while the active semiconductor layers 108 are composed of silicon (Si). It should be appreciated that the differences in the material composition of the sacrificial layers 106 and the active semiconductor layers 108 allow for selective removal of the first type sacrificial layers 106 without removing the active semiconductor layers 108 (i.e., one layer is selectively etched relative to the other layer), as described in further detail below with respect to FIGS. 5 and 8.

In certain embodiments, the sacrificial layers 106 have a vertical thickness ranging, for example, from approximately 3 nm to approximately 10 nm. In certain embodiments, the active semiconductor layers 108 also have a vertical thickness ranging, for example, from approximately 3 nm to approximately 10 nm. Although the range of 3-10 nm is cited as an example range of thickness, other thicknesses of these layers may be used.

In certain embodiments, it may be desirable to have a small vertical spacing (VSP) between adjacent nanosheets in a stack of nanosheets to reduce the parasitic capacitance associated with the HNS-FET, so as to improve circuit speed. For example, the VSP (the thickness between the bottom surface of a first nanosheet and the top surface of an adjacent second nanosheet) may range from 5 nm to 15 nm. However, the VSP must be of a sufficient value to accommodate the gate stack to be formed therein. A gate stack generally includes a work function metal (WFM) that sets the threshold voltage (Vt) of the device, a high-κ gate dielectric material separating the WFM from the nanosheets, and other metals that may be desired to further fine tune the effective work function (eWF) and/or to achieve a desired resistance value associated with current flow through the gate stack in the direction parallel to the plane of the nanosheets.

Referring again to FIG. 1, in certain embodiments, following the formation of the nanosheet stack 150 (e.g., all of the layers of 106 and 108), a hardmask cap (not shown) is formed for nanosheet patterning. The hardmask cap can be composed of various nitride materials including, but not limited to, silicon nitride (SiN). The semiconductor nanosheet device 100 illustrated in FIG. 1 is at the stage of manufacturing following a fin etching process to expose portions of the substrate 102. The fin etching process is achieved, for example, using a directional reactive ion etch (RIE) process, which is capable of removing portions of the sacrificial layers 106 and the active semiconductor layers 108 not covered by the hardmask cap. The RIE can use a boron-based chemistry or a chlorine-based chemistry, for example, which selectively recesses the exposed portions sacrificial layers 106 and the active semiconductor layers 108 without attacking the substrate 102. The hardmask cap (not shown) is removed by any suitable method known by one of skill in the art. For example, a first direction RIE process can be performed to remove the hardmask cap and expose the underlying nanosheet stack 150, as shown in FIG. 1.

Following the nanosheet patterning process described above, shallow trench isolation (STI), also known as a box isolation technique, is performed on the semiconductor nanosheet device 100. In general, STI is an integrated circuit feature which prevents electric current leakage between adjacent semiconductor device components. STI is generally used on CMOS process technology nodes of 250 nanometers and smaller. In general, the STI process involves etching a pattern of trenches in the silicon substrate 102 and then depositing one or more dielectric materials (such as silicon dioxide) to fill the trenches and form the STI regions 104 that are shown in FIG. 1.

In certain embodiments, the semiconductor nanosheet device 100 shown in FIG. 1 also includes a dummy gate 110 that has transformed into polycrystalline (PC) Si due to annealing. The dummy gate 110 is formed by any suitable deposition technique known by one of skill in the art. In one example, the dummy gate 110 is formed by depositing a thin SiO$_2$ layer, followed by depositing a layer of amorphous Si (a-Si). Portions of the dummy gate 110 are later removed, as further discussed below with reference to FIG. 2. As shown in FIG. 1, following deposition of the dummy gate 110, masking layers are formed on the dummy gate 110. The masking layers can include a nitride layer 112, an oxide layer 114 and a hardmask layer 116. After formation of the masking layer pattern, etching is performed to remove portions of the dummy gate 110 that are not covered by the hardmask layer 116.

Figure 2:
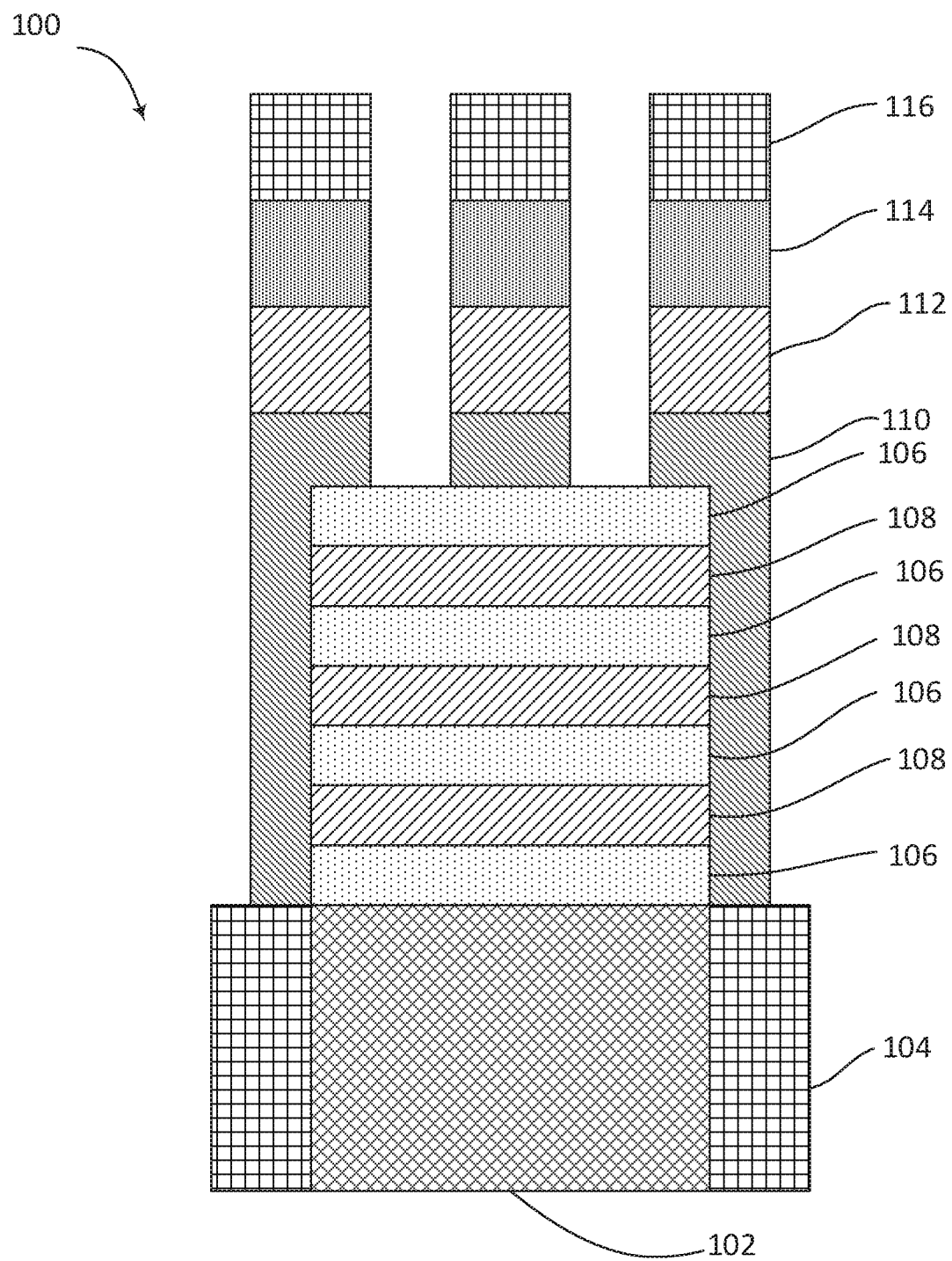
FIG. 2 depicts a cross-sectional view of the semiconductor nanosheet device of FIG. 1 after additional fabrication operations, according to embodiments.

Referring now to FIG. 2, after the etching process is performed on the semiconductor nanosheet device 100, portions of the dummy gate 110 have been removed to expose portions of the upper surface of the topmost sacrificial layer 106, as well as portions of the upper surface of the STI regions 104. This removal process may be performed with, for example, reactive ion etching (RIE). In certain embodiments, upon removal of the portions of the dummy gate 110 with RIE, an amount of ethylene glycol (EG) oxide may be formed on the exposed surfaces of the topmost sacrificial layer 106, and in certain embodiments this EG oxide is removed.

Figure 3:
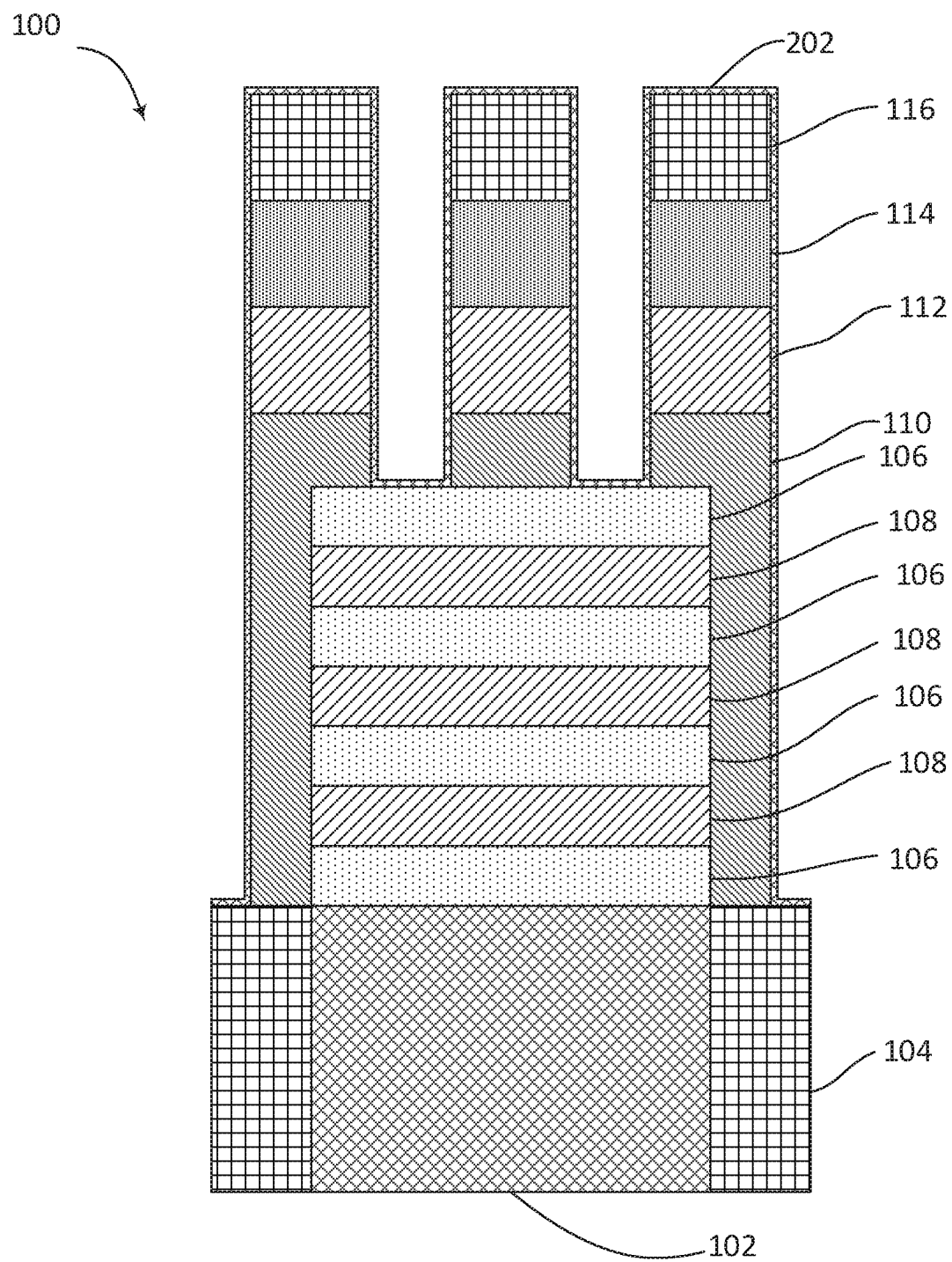
FIG. 3 depicts a cross-sectional view of the semiconductor nanosheet device of FIG. 2 after additional fabrication operations, according to embodiments.

Referring now to FIG. 3, a thin conformal coating of a low-κ spacer 202 layer is formed between the devices. In general, in semiconductor manufacturing, a low-κ material is a material with a small relative dielectric constant relative to silicon dioxide. The low-κ dielectric material layer separates the conducting parts (wire interconnects and transistors) of the different DMTJ devices from one another. As shown in FIG. 3, all exposed surfaces are initially covered with the low-κ spacer 202, including top and side surfaces of the hardmask layer 116, side surfaces of the oxide layer 114, side surfaces of the nitride layer 112, side surfaces of the dummy gate 110, the upper surfaces of the topmost sacrificial layer 106, and upper surfaces of the STI regions 104.

Figure 4:
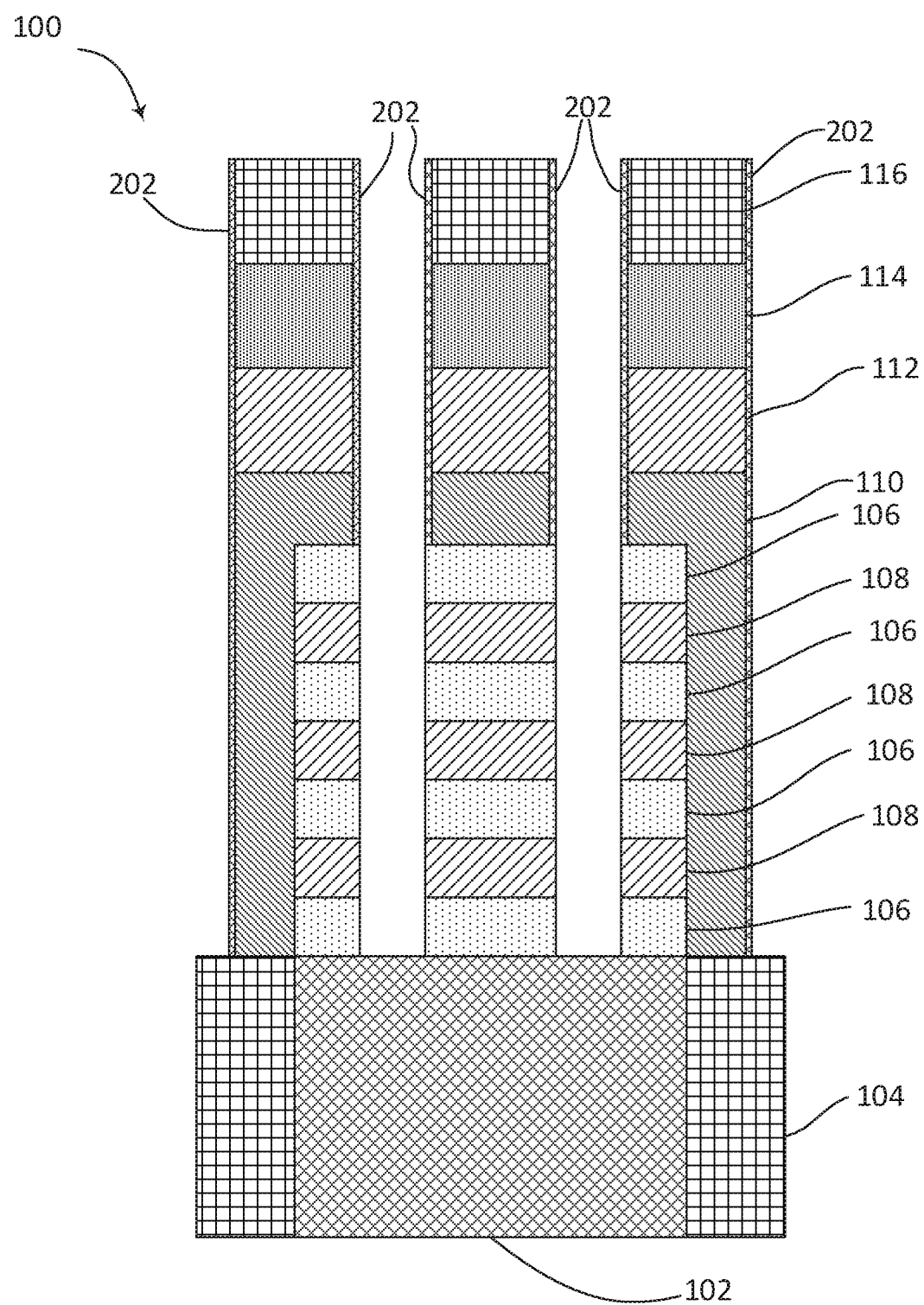
FIG. 4 depicts a cross-sectional view of the semiconductor nanosheet device of FIG. 3 after additional fabrication operations, according to embodiments.

Referring now to FIG. 4, a directional etching process is performed on the semiconductor nanosheet device 100. The semiconductor nanosheet device 100 is illustrated in FIG. 4 following a fin etching process to expose portions of the substrate 102. The fin etching process is achieved, for example, using a directional reactive ion etch (RIE) process, which is capable of removing portions of the sacrificial layers 106 and the active semiconductor layers 108 not covered by the hardmask layer 116. The RIE can use a boron-based chemistry or a chlorine-based chemistry, for example, which selectively recesses the exposed portions of the sacrificial layers 106 and the active semiconductor layers 108 without attacking the substrate 102 or the STI regions 104. Moreover, during the etching process, horizontal portions of the recently created low-κ spacer 202 are removed, including the horizontal portions covering the hardmask layer 116 and the STI regions 104. At this stage of the manufacturing process, sidewalls of the sacrificial layers 106 and the active semiconductor layers 108 are exposed for further processing.

Figure 5:
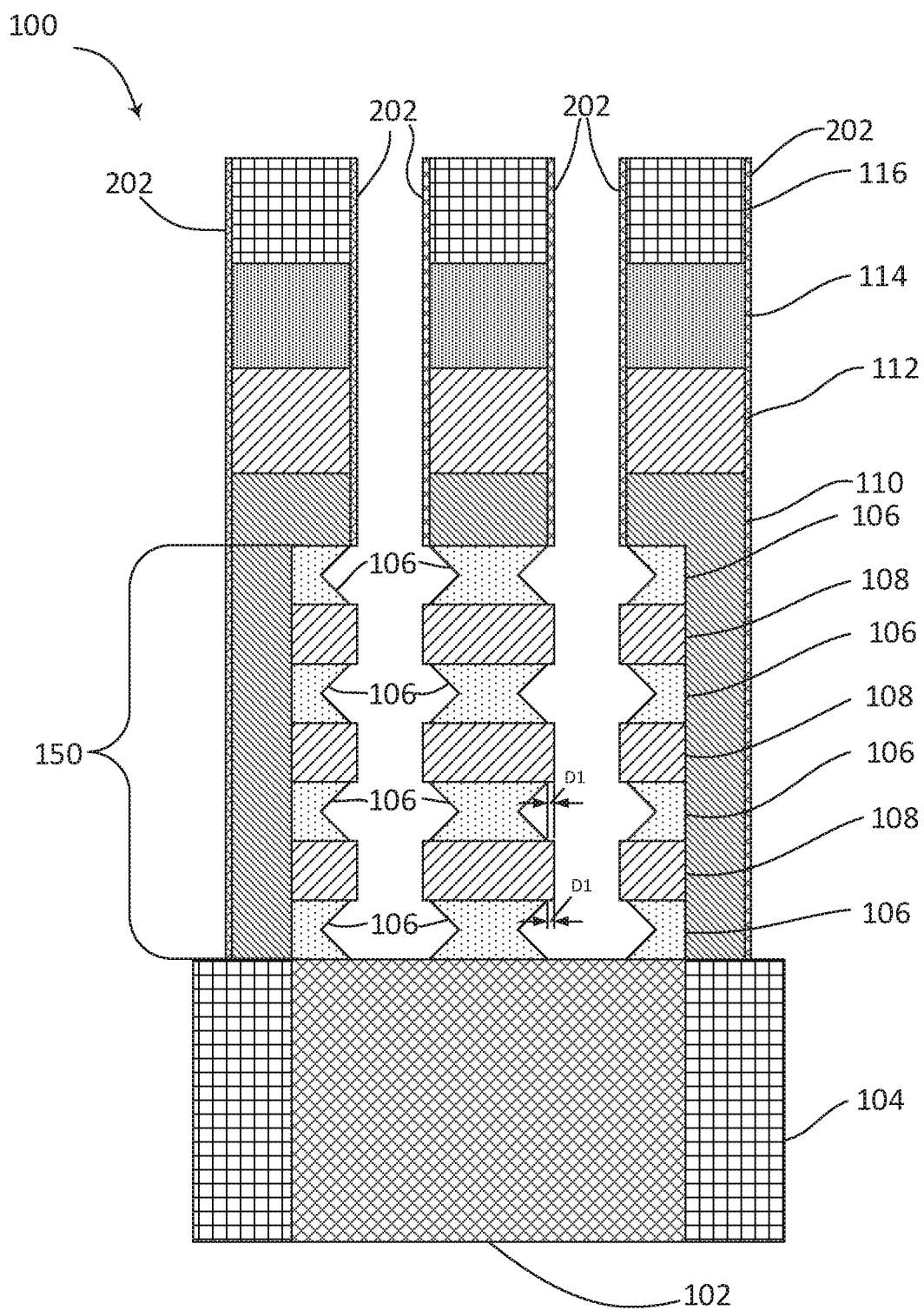
FIG. 5 depicts a cross-sectional view of the semiconductor nanosheet device of FIG. 4 after additional fabrication operations, according to embodiments.

Referring now to FIG. 5, following the directional removal process described above with respect to FIG. 4, a wet etch is performed to remove portions of the sacrificial layers 106. In particular, a wet etching technique is used to remove the material (e.g., SiGe) of the sacrificial layers 106 along a crystalline <111> plane. This results in a sigma-shaped indent (i.e., an angular or triangular indent having an apex) in each of the sidewalls of the sacrificial layers 106. This etching process is a self-limiting process that stops at the apex of the indent. This results in improvements in top to bottom uniformity for the nanosheet stack 150, and also improved uniformity across the wafer due to the relatively slow etching speed. Thus, the etching is well controlled.

In certain embodiments, after the basic indent shapes in the sacrificial layers 106 have been formed, a certain amount of overetch can be applied to move the apex of the indent further inward. In the example shown in FIG. 5, the overetch is illustrated by etching a further distance D1 horizontally inward. Thus, small portions of the upper and lower surfaces of the active semiconductor layers 108 (i.e., in the vicinities near where distances D1 are indicated) are exposed.

Figure 6:
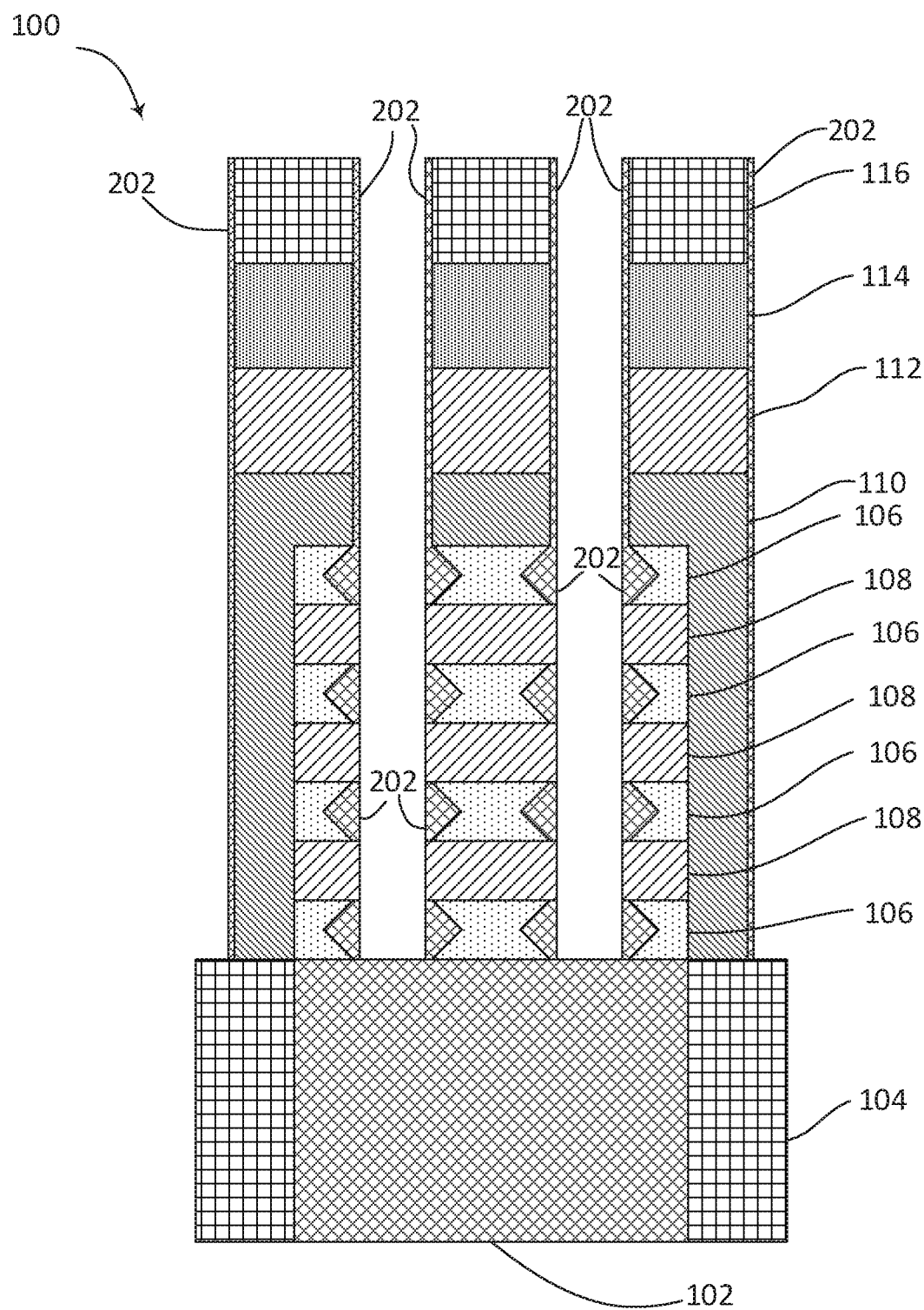
FIG. 6 depicts a cross-sectional view of the semiconductor nanosheet device of FIG. 5 after additional fabrication operations, according to embodiments.

Referring now to FIG. 6, following the formation of the indented regions of the sacrificial layers 106, further material of the low-κ spacer 202 layer is redeposited to fill the indented regions. Initially some of this low-κ spacer 202 layer material may intrude beyond the indent region and into the trenches previously formed in the etching step described above with respect to FIG. 4. However, in certain embodiments, an additional directional etching process similar to what was described in relation to FIG. 4 is performed on the semiconductor nanosheet device 100 to even out the sidewall profile of the additional low-κ spacer 202 material, as shown in FIG. 6.

Figure 7:
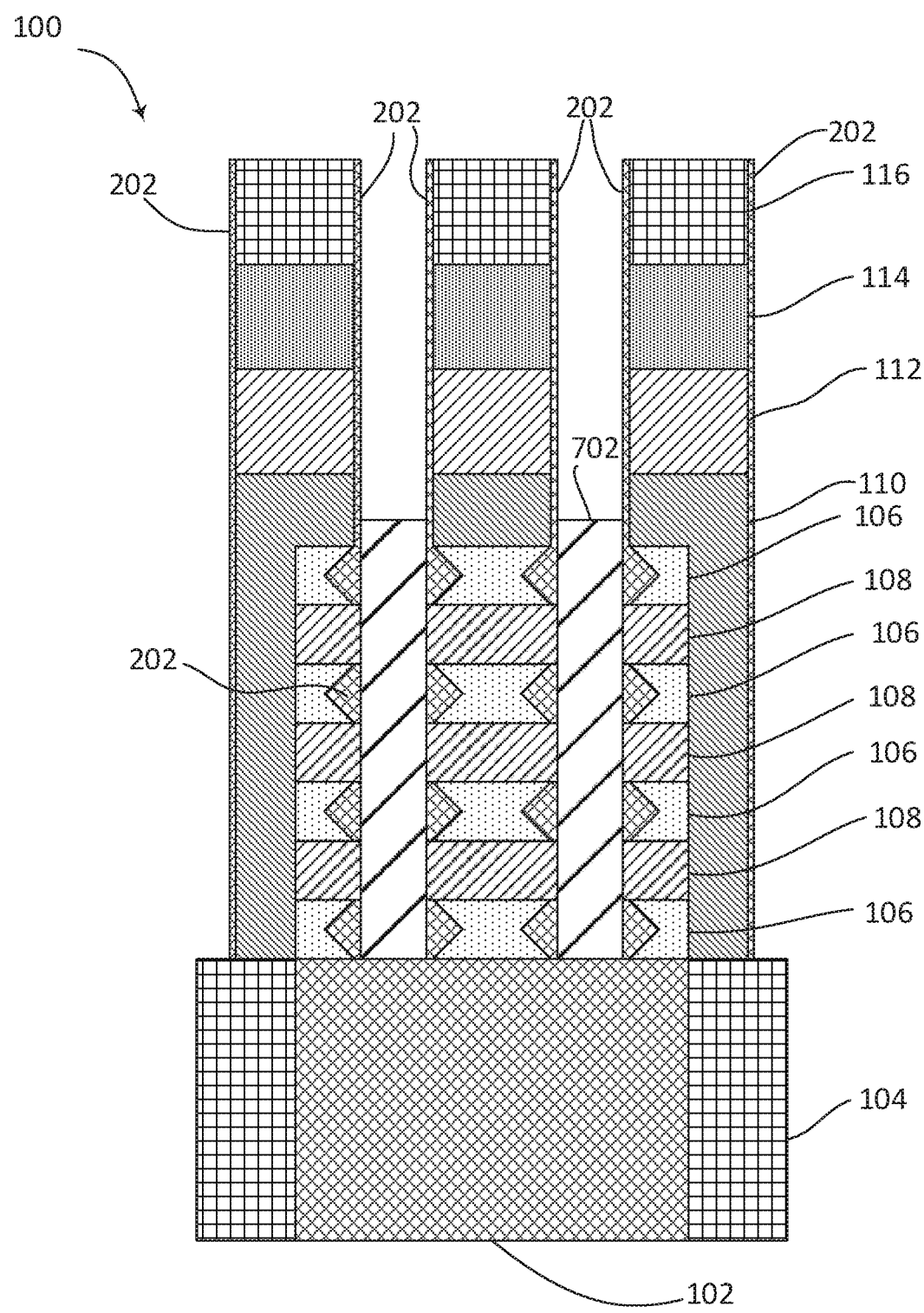
FIG. 7 depicts a cross-sectional view of the semiconductor nanosheet device of FIG. 6 after additional fabrication operations, according to embodiments.

Referring now to FIG. 7, following the directional etching of the low-κ spacer 202 material from the structure, raised source drain (RSD) regions 702 are formed on the exposed portions of semiconductor substrate 102. In certain embodiments, the RSD regions 702 are formed utilizing a conventional epitaxial Si growth process. The silicon may be single crystal. The RSD regions 702 may also be formed by the selective growth of silicon-germanium. The silicon-germanium may be single crystal. In another embodiment, the RSD regions 702 may be composed of SiGe.

The resultant structure, including RSD regions 702, is shown, for example, in FIG. 7. The term "raised" as used herein with respect to RSD regions, is used to describe an RSD region having an upper surface that is vertically offset and above the upper surface of the semiconductor substrate 102.

In an embodiment in which the RSD regions 702 are composed of SiGe, the SiGe layer may be formed by a selective epitaxial process using a combination of: a Si containing gas, such as silane ($SiH_4$), dichlorosilane ($SiH_2Cl_2$), disilane ($Si_2H_6$), trisilane ($Si_3H_8$) or tetrasilane ($Si_4H_{10}$); a germanium containing gas, such as germane ($GeH_4$) or digermane ($Ge_2H_6$); a carrier gas such as nitrogen, hydrogen, or argon; and an optional etchant gas such as hydrogen chloride (HCl) or chlorine ($Cl_2$), at a temperature ranging preferably from approximately 450° C. to approximately 900° C. The SiGe layer may have a Ge concentration of approximately 15% to approximately 100%, and preferably from approximately 20% to approximately 60%.

In an embodiment, at least one of the RSD regions 702 is in-situ doped with a p-type conductivity dopant during the selective epitaxial growth process. P-type field effect transistor semiconductor devices (PFETs) are typically produced by doping the SD regions with a p-type dopant comprising elements from group III of the Periodic Table of Elements, including boron, aluminum, gallium, indium, or alloys thereof. In one embodiment, at least one of the RSD regions 702 may have a p-type dopant in a concentration ranging from approximately $4 \times 10^{20}$ atoms/cm$^3$ to approximately $2.5 \times 10^{21}$ atoms/cm$^3$. In another embodiment, the p-type conductivity dopant may be introduced to at least one of the RSD regions 702 using ion implantation following the selective epitaxial growth process that is used to form the RSD regions 702.

In an embodiment, at least one of the RSD regions 702 is in-situ doped with an n-type conductivity dopant during the selective epitaxial growth process. N-type field effect transistor semiconductor devices (NFETs) are typically produced by doping the SD regions with a dopant comprising elements from group V of the Periodic Table of Elements, including phosphorus, antimony, arsenic, or alloys thereof. In one embodiment, at least one of the RSD regions 702 may have a n-type dopant in a concentration ranging from approximately $4 \times 10^{20}$ atoms/cm$^3$ to approximately $2.5 \times 10^{21}$ atoms/cm$^3$. In another embodiment, the n-type conductivity dopant may be introduced to at least one of the RSD regions 702 using ion implantation following the selective epitaxial growth process that is used to form the RSD regions 702.

In certain embodiments, the dopant of the RSD regions 702 is activated using a thermal annealing process. The thermal annealing process may be provided by a furnace anneal, rapid thermal anneal, or laser anneal. In one example, the temperature of the annealing process ranges from approximately 900° C. to approximately 1300° C. In other examples, the temperature of the annealing process ranges from approximately 1000° C. to approximately 1250° C. The time period of the annealing processes ranges from approximately 10 ms to approximately 60 s. In another embodiment, the time period ranges from approximately 10 ms to approximately 10 s.

Figure 8:
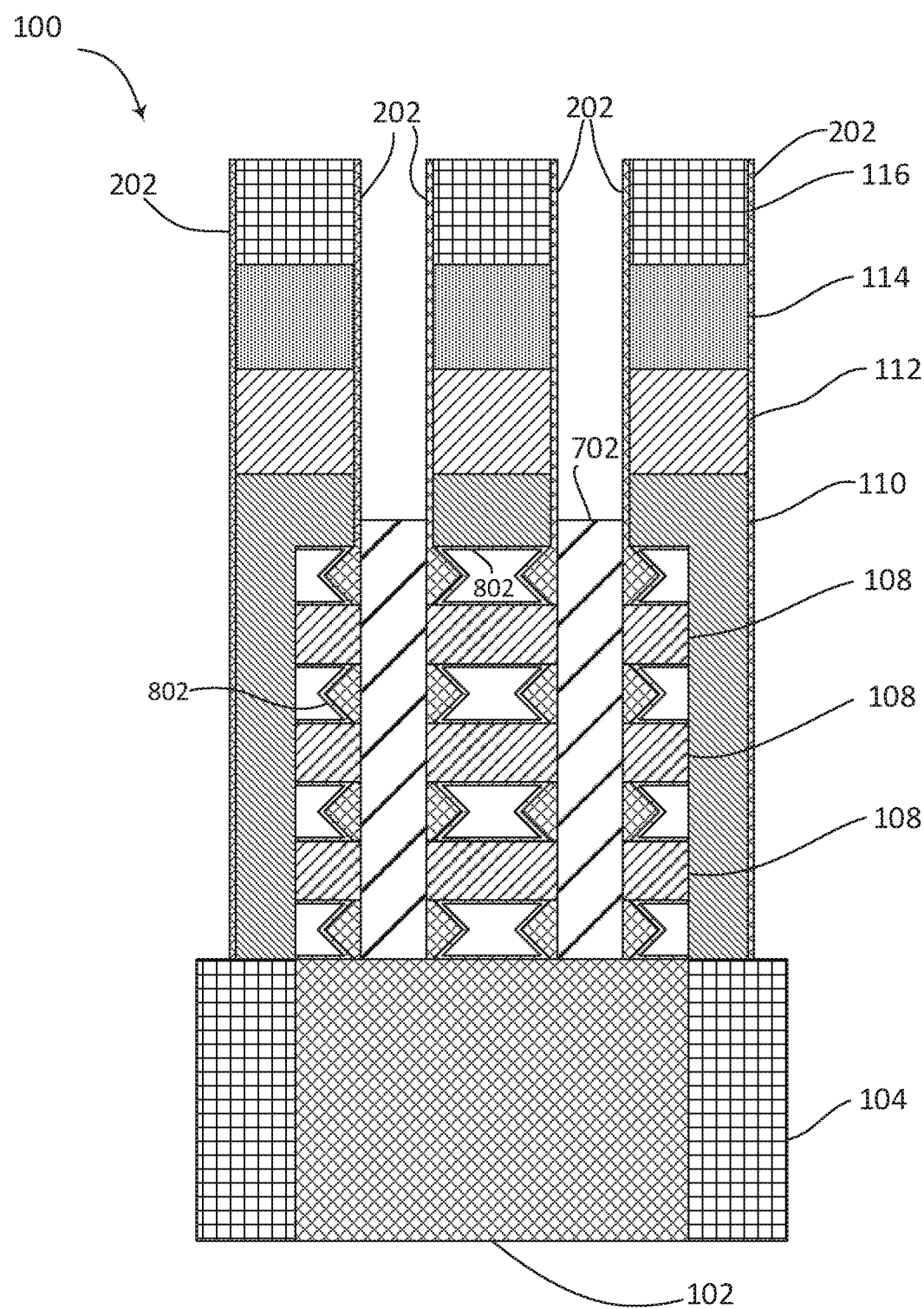
FIG. 8 depicts a cross-sectional view of the semiconductor nanosheet device of FIG. 7 after additional fabrication operations, according to embodiments.

Referring now to FIG. 8, the SiGe material of the sacrificial layers 106 is removed with a wet etching technique using HCl for example. Thus, all of the material of the sacrificial layers 106 has been removed at this stage of the manufacturing process. As also shown in FIG. 8, a conformal high-κ dielectric layer 802 is deposited around all exposed surfaces of the active semiconductor material layers 108 and on all exposed surfaces of the inner low-κ spacer 202. The conformal high-κ dielectric layer 802 comprises a high-κ gate dielectric material. In general, the term high-κ refers to a material with a high dielectric constant (κ, kappa), as compared to silicon dioxide. High-κ dielectrics are used in semiconductor manufacturing processes where they are usually used to replace a silicon dioxide gate dielectric or another dielectric layer of a device. Thus, the term high-κ as used herein refers to a material having a relative dielectric constant κ which is much higher than that of silicon dioxide (e.g., a dielectric constant κ=25 for hafnium oxide ($HfO_2$) rather than 4 for silicon dioxide). Examples of suitable high-κ gate dielectric materials include, but are not limited to, $HfO_2$ and/or lanthanum oxide ($La_2O_3$). In certain embodiments, the material of the high-κ dielectric layer 802 will pinch in in the corners of the triangular inner spacer shape and close a path of possible electrical shorting of the gate metal layer 902 (see, FIG. 9) to the epitaxially grown RSD regions 702.

Figure 9:
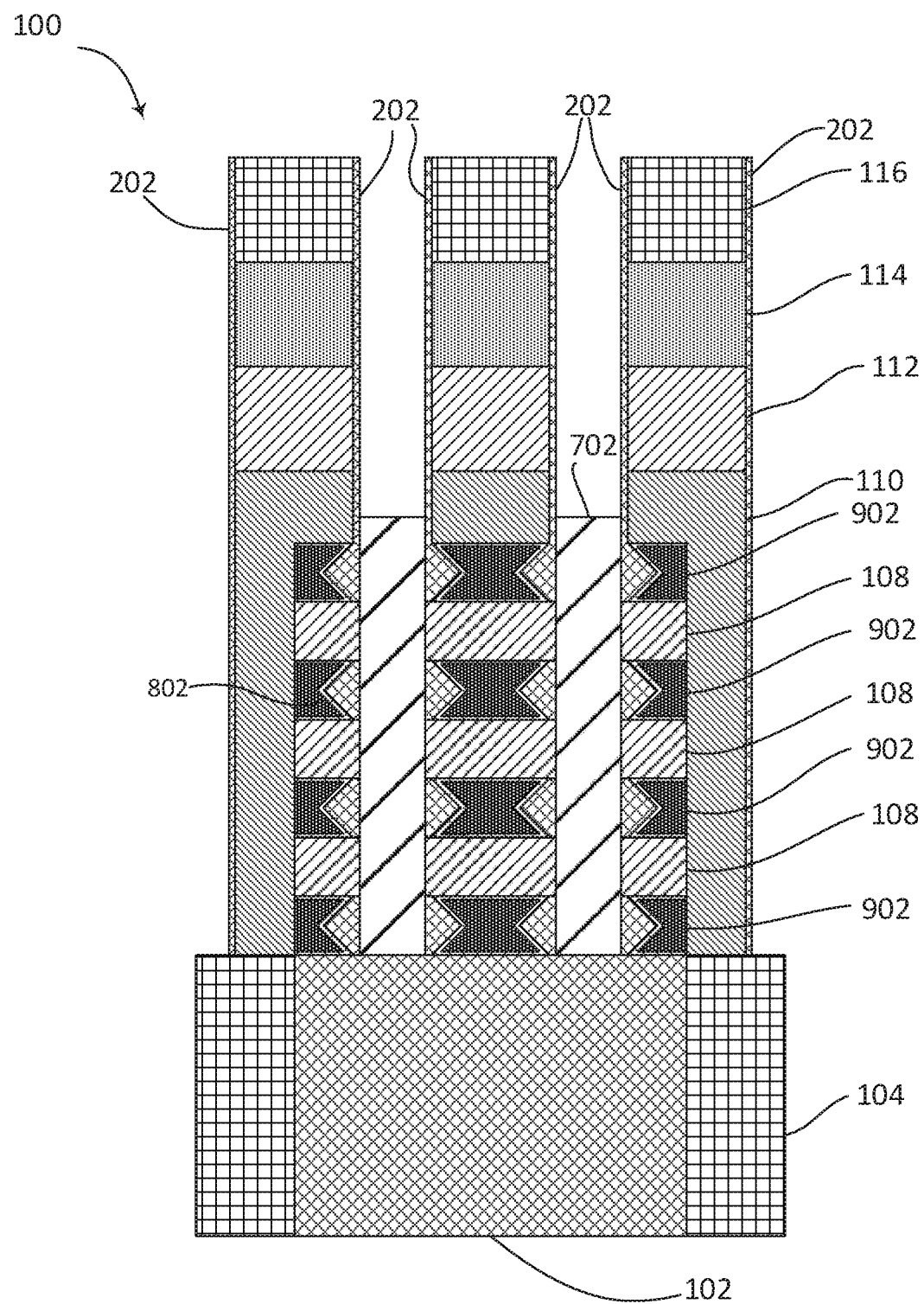
FIG. 9 depicts a cross-sectional view of the semiconductor nanosheet device of FIG. 8 after additional fabrication operations, according to embodiments.

Referring now to FIG. 9, a gate metal layer 902 is formed in the spaces between the high-κ dielectric layer 802 to form the gate all around structure of the semiconductor nanosheet device 100. That is, the gate metal layer 902 is a replacement metal gate (RMG) for the previously removed sacrificial layers 106. In certain examples, the gate metal layer 902 is composed of tungsten (W). However, it should be appreciated that other suitable metal or metal alloys may be used for the gate metal layer 902.

Figure 10A:
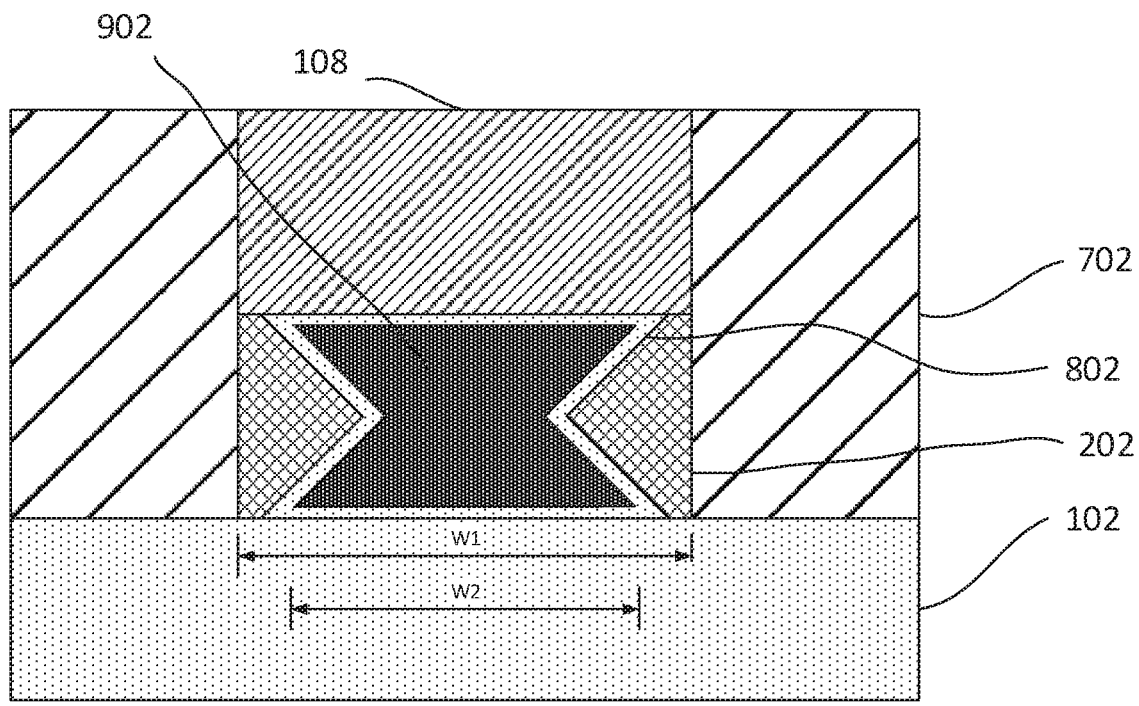
FIG. 10A depicts an enlarged partial cross-sectional view of the semiconductor nanosheet device of FIG. 9 illustrating a shape of the gate stack structure, according to embodiments.

Referring now to FIG. 10A, this is an enlarged partial cross-sectional view of the semiconductor nanosheet device 100 shown in FIG. 9. In this figure, the substrate 102, the RSD regions 702, the high-κ dielectric layer 802, low-κ spacer 202, the active semiconductor layer 108, and the gate metal layer 902 are shown. The active semiconductor layer 108 has a width W1. Because of the sigma shaped indent of the sacrificial layer 106 described above with respect to FIG. 5, followed by the subsequent filling of the indent of the with the low-κ spacer 202 layer and the coating of the high-κ layer 802, there is a uniquely shaped space where the gate metal layer 902 may be formed. In other words, the gate metal layer 902 can be formed to fill in the angular portions of the void space left following the removal of sacrificial layers 106. These angular portions allow the gate metal layer 902 to be formed to a greater width W2 than in related techniques. That is, the sigma indent enables a longer $L_{metal}$ under the same pitch. Because the $L_{metal}$ can be effectively increased relative to related techniques, this leads to the possibility for further pitch scaling reductions without sacrificing the dimensions of the gate metal layer 902.

Figure 10B:
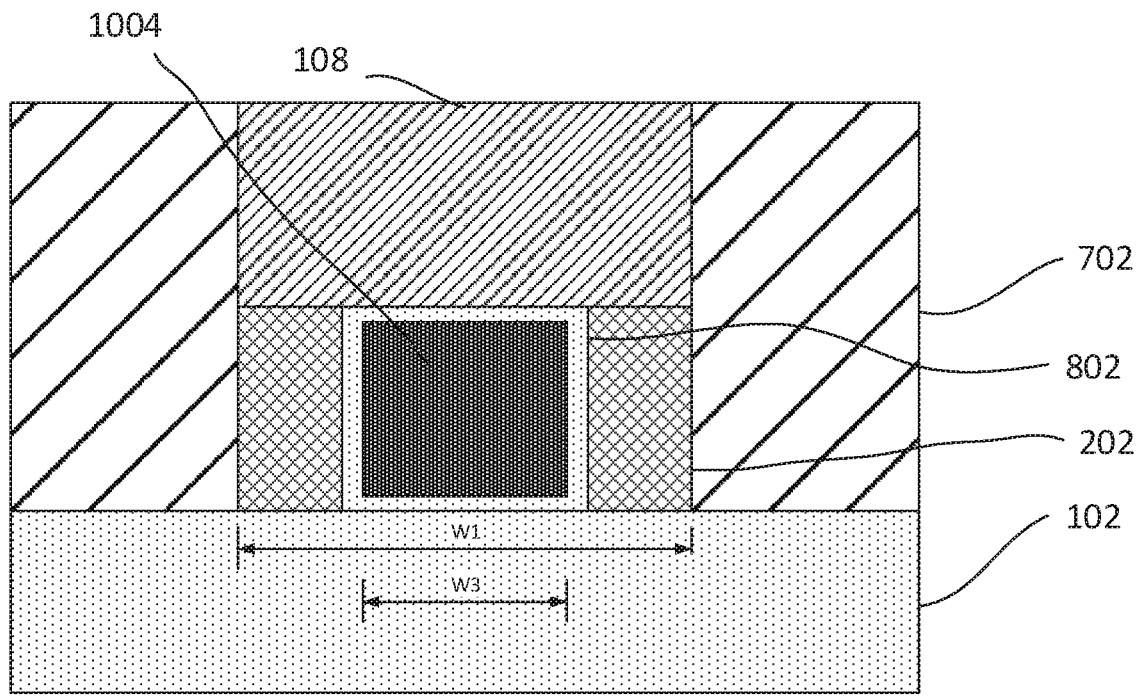
FIG. 10B depicts a partial cross-sectional view of a related semiconductor nanosheet device where the inner spacer and gate stack structure is formed by a timed wet etching technique.

Referring now to FIG. 10B, this is an enlarged partial cross-sectional view of the semiconductor nanosheet device of FIG. 4, but where a different etching technique is applied relative to the sigma shaped etching technique of the present embodiments shown and described above with regard to FIG. 5. With such a related etching technique, the sacrificial layers 106 (not shown in FIG. 10B) are removed inward in such a way that the sidewalls of the sacrificial layers 106 are vertical (or nearly vertical) in contrast to the sigma shaped profile shown in FIG. 10A. As discussed above, related etching techniques for the sacrificial layers 106 result in poor top to bottom uniformity (i.e., some layers have more inward etching that others resulting in different $L_{metal}$ dimensions for the different gate 1004 layers). Moreover, width W3 of the gate metal layer 1004 in FIG. 10B is less than the width W2 of the gate metal layer 902 in the present embodiments related to FIG. 10A.

Figure 11A:
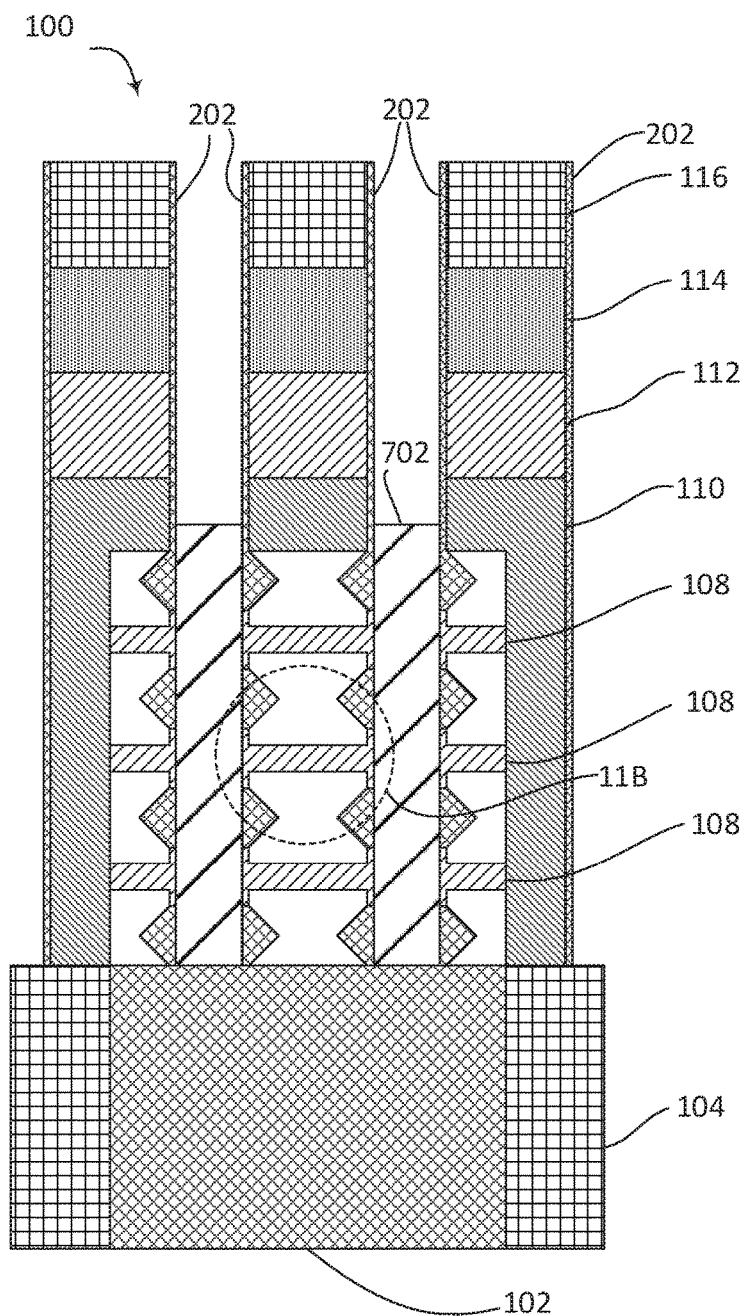
FIG. 11A depicts a cross-sectional view of the semiconductor nanosheet device of FIG. 7 after additional fabrication operations, according to embodiments.
Figure 11B:
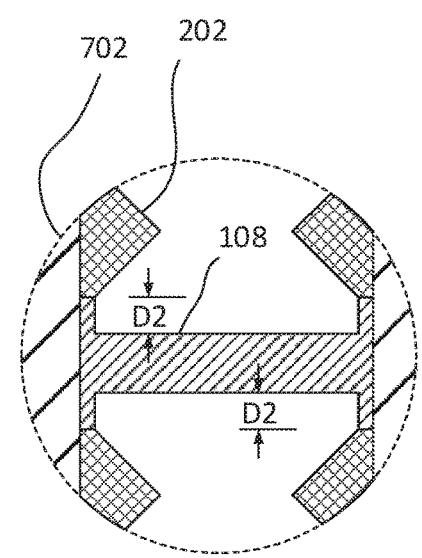
FIG. 11B depicts an enlarged partial cross-sectional view of the semiconductor nanosheet device of FIG. 11A, according to embodiments.

Referring now to FIG. 11A, this figure depicts a cross-sectional view of the semiconductor nanosheet device of FIG. 7 after additional fabrication operations, according to alternative embodiments. In certain embodiments, after formation of the low-κ spacer 202 in the indent region discussed above with respect to FIG. 6, after removal of the sacrificial layers 106 discussed above with respect to FIG. 8, but before the formation of the high-κ layer 802, there is an additional etching process that is applied to remove material from the active semiconductor layers 108. In particular, as shown in the enlarged partial view of FIG. 11B, the thickness of the active semiconductor layers 108 is reduced by a thickness amount D2 on each of the upper and lower sides of the active semiconductor layers 108. Because a certain amount of the low-κ spacer 202 layer covers the active semiconductor layers 108, the etched active material layer 108 is formed into a general "dog bone" shape, where the end portions thereof have the original thickness of the layer, and the middle portions thereof have been made thinner, as shown in FIG. 11B. This may allow for further improvements in gate control electrostatics to enable further $L_{gate}$/pitch scaling in the horizontal direction.

Figure 12:
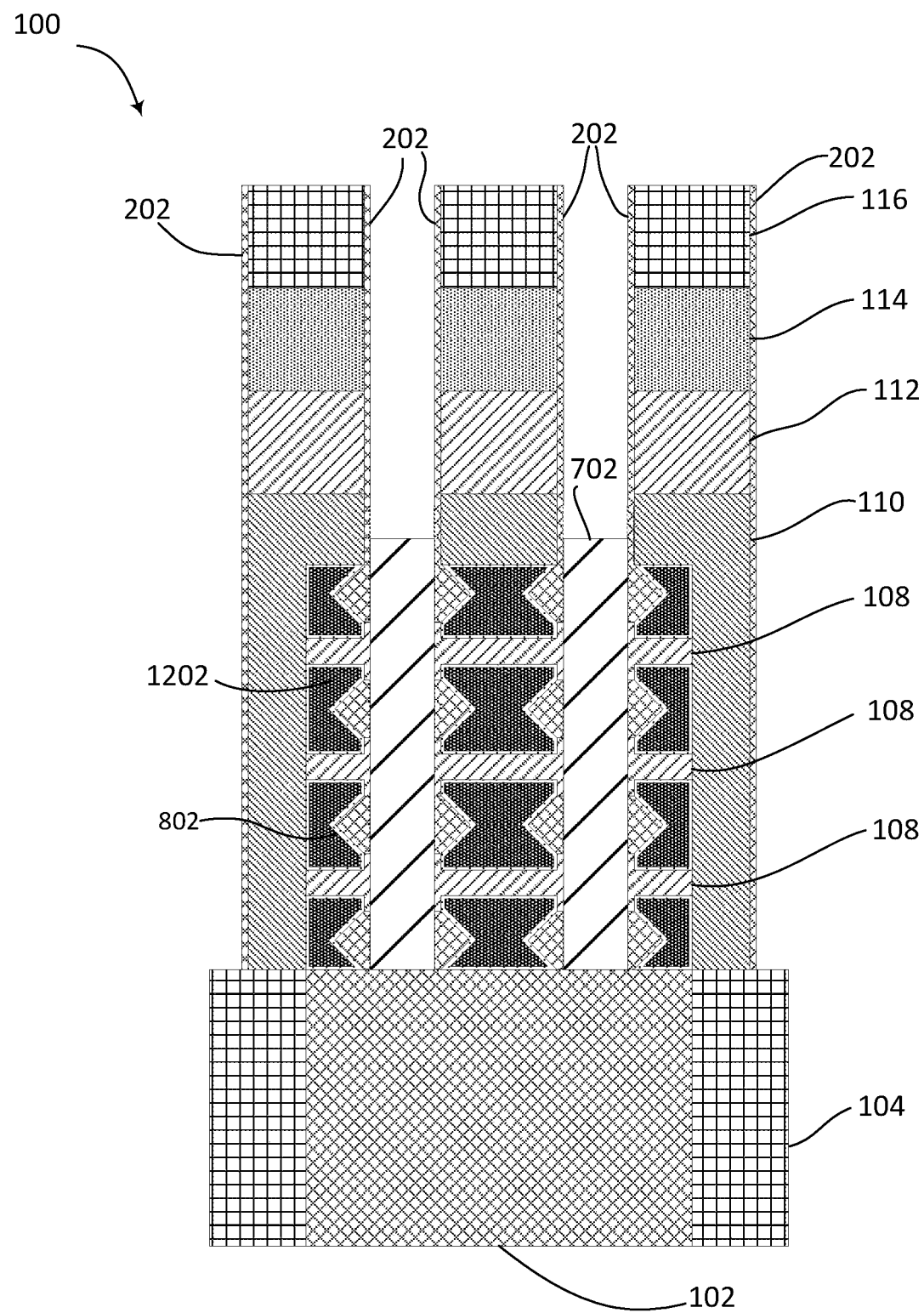
FIG. 12 depicts a cross-sectional view of the semiconductor nanosheet device of FIG. 11A after additional fabrication operations, according to embodiments.

Referring now to FIG. 12, a gate metal layer 1202 is formed in the spaces between the high-κ dielectric layer 802 to form the gate all around structure of the semiconductor nanosheet device 100. That is, the gate metal layer 1202 is a replacement metal gate (RMG) for the previously removed sacrificial layers 106. In certain examples, the gate metal layer 1202 is composed of tungsten (W). However, it should be appreciated that other suitable metal or metal alloys may be used for the gate metal layer 1202.

In the present embodiments, by forming the inner spacer with a self-limiting etch stop at the crystalline <111> planes of the sacrificial SiGe interlayers of the nanosheet device, improvements in top to bottom uniformity and across wafer uniformity can be achieved. Moreover, owing to the angular nature of the indent, the gate structure is able to be formed wider (i.e., $L_{eff}$ extension). This may enable gate CD scaling at the same $L_{eff}$. This is equivalent to further device pitch scaling without sacrificing device performance in the channel electrostatics or contact resistance.

The descriptions of the various embodiments have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a nanosheet field effect transistor (FET) device, the method comprising:
    forming a plurality of nanosheet stacks on a substrate, the nanosheet stacks including alternating layers of sacrificial layers and active semiconductor layers, wherein portions of gate metal layers have angular indents formed in each side thereof;
    removing portions of the sacrificial layers to form the angular indents in each side thereof;
    filling the angular indents with a low-k material layer;
    forming source drain regions between the nanosheet stacks;
    removing remaining portions of the sacrificial layers; and
    forming the gate metal layers in spaces formed by the removal of the sacrificial layers,
    wherein middle portions of the active semiconductor layer are recessed, and a thickness of the gate metal layer is greater than a thickness of the low-k material layer in the angular indents.

2. The method according to claim 1, wherein, prior to forming the gate metal layer, the method further comprises forming a high-κ material layer in the spaced formed by removal of the sacrificial layers.

3. The method according to claim 1, wherein the angular indents extend inward in a horizontal direction to expose portions of top and bottom surfaces of the active semiconductor layers.

4. The method according to claim 3, wherein the low-κ material layer covers the exposed portions of the top and the bottom surfaces of the active semiconductor layers.

5. The method according to claim 1, wherein prior to forming the gate metal layer, the method further comprises:
    forming a high-κ material layer in the spaced formed by removal of the sacrificial layers.

6. The method according to claim 1, wherein the removal of the portions of the sacrificial layers is performed along a <111> crystalline plane of the sacrificial layers.

7. The method according to claim 6, wherein the sacrificial layers are composed of SiGe, and the active semiconductor layers are composed of Si.

8. The method according to claim 1, wherein the gate metal layers have a first width at upper and lower portions thereof is greater than a second width at middle portions thereof.

9. A nanosheet field effect transistor (FET) device comprising:
    a plurality of nanosheet stacks provided on a substrate, the nanosheet stacks including alternating layers of gate metal layers and active semiconductor layers, wherein portions of the gate metal layers have angular indents formed in each side thereof;
    a low-κ material layer filling the indents in the gate metal layers; and
    source drain regions provided between the nanosheet stacks,
    wherein middle portions of the active semiconductor layer are recessed, and a thickness of the gate metal layer is greater than a thickness of the low-κ material layer in the angular indents.

10. The nanosheet FET device according to claim 9, further comprising a high-κ material layer surrounding the gate metal layers, the high-κ material layer being in contact with a channel.

11. The nanosheet FET device according to claim 9, wherein the low-κ material layer extends inward in a horizontal direction to contact portions of top and bottom surfaces of the active semiconductor layers.

12. The nanosheet FET device according to claim 9, wherein the angular indents are triangular shaped and formed along a crystalline <111>.

13. The nanosheet FET device according to claim 9, further comprising a high-κ material layer, where the gate metal layers surround the high-κ material layer.

14. The nanosheet FET device according to claim 9, wherein the active semiconductor layers are composed of silicon.

15. The nanosheet FET device according to claim 9, wherein the gate metal layers have a first width at upper and lower portions thereof is greater than a second width at middle portions thereof.

16. The nanosheet FET device according to claim 9, wherein the source drain regions are composed of at least one of silicon, germanium, and SiGe.

17. The nanosheet FET device according to claim 9, further comprising:
    shallow trench isolation regions of the substrate formed at locations not covered by the nanosheet stacks.

* * * * *